United States Patent
Lee et al.

(10) Patent No.: US 11,201,226 B2
(45) Date of Patent: Dec. 14, 2021

(54) AMPLIFIER HAVING SWITCH AND SWITCH CONTROL PROCESSOR CONTROLLING SWITCH

(71) Applicant: Samsung Electronics Co., Ltd., Suwon-si (KR)

(72) Inventors: Sangmin Lee, Suwon-si (KR); Youngchang Yoon, Suwon-si (KR); Daehoon Kwon, Suwon-si (KR); Jaehyup Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 71 days.

(21) Appl. No.: 16/750,826

(22) Filed: Jan. 23, 2020

(65) Prior Publication Data

US 2020/0243661 A1    Jul. 30, 2020

(30) Foreign Application Priority Data

Jan. 24, 2019    (KR) .................. 10-2019-0009121

(51) Int. Cl.
*H03G 3/30*    (2006.01)
*H01L 29/43*    (2006.01)
(Continued)

(52) U.S. Cl.
CPC ........ *H01L 29/435* (2013.01); *H01L 29/1058* (2013.01); *H03F 3/195* (2013.01);
(Continued)

(58) Field of Classification Search
CPC ...... H03G 1/0088; H03G 3/30; H03G 3/3026; H01L 29/1058
(Continued)

(56) References Cited

U.S. PATENT DOCUMENTS 5,369,711 A    11/1994   Williamson, III
5,387,879 A    2/1995    Satoh
(Continued)

FOREIGN PATENT DOCUMENTS

EP    0 774 834 B1    11/2001
JP    2008-187329 A    8/2008

OTHER PUBLICATIONS

Dimitrios Psyllos, Yannis Papananos, "Active-RC Chebyshev Low-Pass Filter with 500MHz Passband Frequency in 90nm Standard CMOS", 2nd Pan-Hellenic Conference on Electronics and Telecommunications Mar. 16, 2012.
(Continued)

*Primary Examiner* — Steven J Mottola
(74) *Attorney, Agent, or Firm* — Jefferson IP Law, LLP

(57) ABSTRACT

The present disclosure relates to a pre-5th-Generation (5G) or 5G communication system to be provided for supporting higher data rates Beyond 4th-Generation (4G) communication system such as Long Term Evolution (LTE).
An amplifier is provided. The amplifier includes a first resistor electrically connected to the input terminal, a second resistor electrically connected to the output terminal, a switch including a metal-oxide-semiconductor field-effect transistor (MOSFET) and electrically connected to one end of the second resistor, and a switch control processor configured to electrically connect the gate terminal of the MOSFET constituting the switch and the bulk terminal of the MOSFET constituting the switch to an impedance having an impedance value higher than a preset first threshold.

20 Claims, 8 Drawing Sheets

(51) Int. Cl.
　　　*H01L 29/10*　　(2006.01)
　　　*H03F 3/45*　　(2006.01)
　　　*H03G 1/00*　　(2006.01)
　　　*H03F 3/195*　　(2006.01)
　　　*H03K 17/687*　　(2006.01)

(52) U.S. Cl.
　　　CPC ....... *H03F 3/45475* (2013.01); *H03G 1/0088* (2013.01); *H03K 17/6872* (2013.01)

(58) Field of Classification Search
　　　USPC .................................................. 330/86, 282
　　　See application file for complete search history.

(56) References Cited

U.S. PATENT DOCUMENTS

| | | | |
|---|---|---|---|
| 5,721,513 | A | 2/1998 | Yuasa |
| 9,831,842 | B2 | 11/2017 | Kiritani |
| 10,063,201 | B2 | 8/2018 | Kiritani |
| 2004/0239421 | A1 | 12/2004 | Wang et al. |
| 2005/0052230 | A1* | 3/2005 | Kakitani ............. H03G 1/0088 330/51 |
| 2009/0261903 | A1 | 10/2009 | Touzard et al. |
| 2011/0133837 | A1 | 6/2011 | Komori |
| 2018/0062646 | A1* | 3/2018 | Herrera ................. H03F 1/342 |
| 2018/0091107 | A1 | 3/2018 | Matsuno et al. |

OTHER PUBLICATIONS

P. Wambacq, V. Giannini, K. Scheir, W. Van Thillo, Y. Rolain, "A fifth-order 880MHz/1.76GHz active lowpass filter for 60GHz communications in 40nm digital CMOS", 2010 Proceedings of ESSCIRC, Sep. 14, 2010.

S. Kousai, M. Hamada, R. Ito, T. Itakura, "A 19.7 MHz, Fifth-Order Active-RC Chebyshev LPF for Draft IEEE802.11n With Automatic Quality-Factor Tuning Scheme", IEEE Journal of Solid-State Circuits, pp. 2326-2337, Nov. 2007.

V. Saari, M. Kaltiokallio, S. Lindfors, J. Ryynanen, K. A. I. Halonen, "A 240-MHz Low-Pass Filter With Variable Gain in 65-nm CMOS for a UWB Radio Receiver", IEEE Transactions on Circuits and Systems I: Regular Papers, pp. 1488-1499, Jul. 2009.

H. Y. Shih, C. N. Kuo, W. H. Chen, T. Y. Yang, K. C. Juang, "A 250 MHz 14 dB-NF 73 dB-Gain 82 dB-DR Analog Baseband Chain With Digital-Assisted DC-Offset Calibration for Ultra-Wideband", IEEE Journal of Solid-State Circuits, pp. 338-350, Feb. 2010.

T. Laxminidhi, V. Prasadu, S. Pavan, "Widely Programmable High-Frequency Active RC Filters in CMOS Technology", IEEE Transactions on Circuits and Systems I: Regular Papers, pp. 327-336, Feb. 2009.

International Search Report and Written Opinion dated May 7, 2020, Issued in International Application No. PCT/KR2020/001149.

* cited by examiner

AMPLIFIER HAVING SWITCH AND SWITCH CONTROL PROCESSOR CONTROLLING SWITCH

CROSS-REFERENCE TO RELATED APPLICATION(S)

This application is based on and claims priority under 35 U.S.C. § 119(a) of a Korean patent application number 10-2019-0009121, filed on Jan. 24, 2019, in the Korean Intellectual Property Office, the disclosure of which is incorporated by reference herein in its entirety.

BACKGROUND

1. Field

The disclosure relates to an amplifier that includes a plurality of switches and a switch control circuit to thereby adjust the gain.

2. Description of Related Art

Since the commercial deployment of 4th generation (4G) communication systems, efforts have been made to develop improved 5th generation (5G) or pre-5G communication systems to meet the ever increasing demand for wireless data traffic. As such, 5G or pre-5G communication systems are also called "beyond 4G network" or "post long term evolution (LTE) system." To achieve higher data rates, 5G communication systems consider utilization of the mmWave band (e.g., 60 GHz band). To decrease path loss and increase the transmission distance in the mmWave band, various technologies including beamforming, massive multiple-input multiple-output (massive MIMO), full dimensional MIMO (FD-MIMO), array antennas, analog beamforming, and large scale antennas are considered for 5G communication systems. To improve system networks in 5G communication systems, technology development is under way regarding evolved small cells, advanced small cells, cloud radio access networks (cloud RANs), ultra-dense networks, device-to-device (D2D) communication, wireless backhaul, moving networks, cooperative communication, coordinated multi-points (CoMP), reception interference cancellation, and the like. In addition, advanced coding and modulation (ACM) schemes such as hybrid frequency shift keying (FSK) and quadrature amplitude modulation (QAM) (FQAM) and sliding window superposition coding (SWSC), and advanced access technologies such as filter bank multi carrier (FBMC), non-orthogonal multiple access (NOMA), and sparse code multiple access (SCMA) are also under development for 5G communication systems.

Meanwhile, the Internet is evolving from a human centered network where humans create and consume information into the Internet of Things (IoT) where distributed elements or things process and exchange information. There has also emerged the Internet of Everything (IoE) technology that combines IoT technology with big data processing technology through connection with cloud servers. To realize IoT services, base technologies related to sensing, wired/wireless communication and network infrastructure, service interfacing, and security are needed, and technologies interconnecting things such as sensor networks, machine-to-machine (M2M) or machine type communication (MTC) are under development. In IoT environments, it is possible to provide intelligent Internet technology services, which collect and analyze data created by interconnected things to add new values to human life. Through convergence and combination between existing information technologies and various field technologies, IoT technology may be applied to various areas such as smart homes, smart buildings, smart cities, smart or connected cars, smart grids, health-care, smart consumer electronics, and advanced medical services.

Accordingly, various attempts are being made to apply 5G communication systems to IoT networks. For example, sensor networks and machine-to-machine or machine type communication are being realized by use of 5G communication technologies including beamforming, MIMO, and array antennas. Application of cloud RANs to big data processing described above may be an instance of convergence of 5G communication technology and IoT technology.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an apparatus to change the gain of an amplifier including a resistor element. A plurality of switches may be required, and each switch may be implemented using a metal-oxide-semiconductor field-effect transistor (MOSFET). Meanwhile, in a 5G mobile communication system using the mmWave band, the performance (e.g., gain or bandwidth) of the amplifier may be reduced due to parasitic capacitance components caused by the MOSFETs. Accordingly, there is a need for an amplifier structure that can solve this problem.

Additional aspects will be set forth in part in the description which follows and, in part, will be apparent from the description, or may be learned by practice of the presented embodiments.

In accordance with an aspect of the disclosure, an amplifier is provided. The amplifier includes a first resistor electrically connected to the input terminal, a second resistor electrically connected to the output terminal, a switch including a MOSFET and electrically connected to one end of the second resistor, and a switch control processor configured to electrically connect the gate terminal of the MOSFET constituting the switch and the bulk terminal of the MOSFET constituting the switch to an impedance having an impedance value higher than a preset first threshold.

In accordance with another aspect of the disclosure, an electronic device having an amplifier is provided. The amplifier includes a first resistor electrically connected to the input terminal, a second resistor electrically connected to the output terminal, a switch including a MOSFET and electrically connected to one end of the second resistor, and a switch control processor configured to electrically connect the gate terminal of the MOSFET constituting the switch and the bulk terminal of the MOSFET constituting the switch to an impedance having an impedance value higher than a preset first threshold.

According to an embodiment of the disclosure, it is possible to prevent reduction of the gain of the amplifier due to the parasitic capacitance caused by the MOSFET constituting the switch. In addition, it is possible to prevent reduction of the bandwidth of the amplifier due to the Miller effect.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features and advantages of certain embodiments of the disclosure will be more apparent from the following description, taken in conjunction with the accompanying drawings, in which.

Throughout the drawings, like reference numerals will be understood to refer to like parts, components, and structures.

DETAILED DESCRIPTION

Figure 1A:
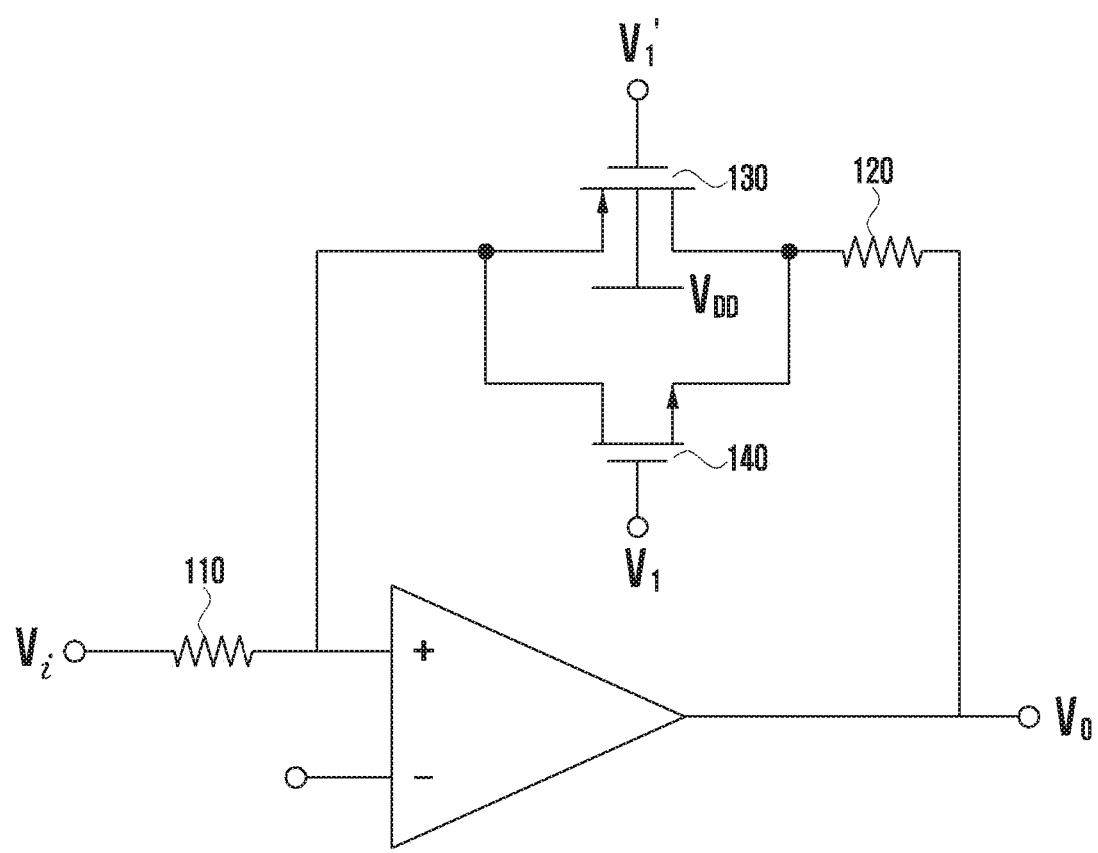
FIG. 1A shows the structure of an amplifier according to the related art.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In the drawings, some elements are exaggerated, omitted, or only outlined in brief, and thus may be not drawn to scale. The same or similar reference symbols are used throughout the drawings to refer to the same or like parts.

The aspects, features, and advantages of certain embodiments of the disclosure will be more apparent from the following detailed description taken in conjunction with the accompanying drawings. The description of the various embodiments is to be construed as exemplary only and does not describe every possible instance of the disclosure. It should be apparent to those skilled in the art that the following description of various embodiments of the disclosure is provided for illustrative purposes only and not for the purpose of limiting the disclosure as defined by the appended claims and their equivalents. The same reference symbols are used throughout the description to refer to the same parts.

Meanwhile, it is known to those skilled in the art that blocks of a flowchart (or sequence diagram) and a combination of flowcharts may be represented and executed by computer program instructions. These computer program instructions may be loaded on a processor of a general purpose computer, special purpose computer, or programmable data processing equipment. When the loaded program instructions are executed by the processor, they create a means for carrying out functions described in the flowchart. As the computer program instructions may be stored in a computer readable memory that is usable in a specialized computer or a programmable data processing equipment, it is also possible to create articles of manufacture that carry out functions described in the flowchart. As the computer program instructions may be loaded on a computer or a programmable data processing equipment, when executed as processes, they may carry out operations of functions described in the flowchart.

A block of a flowchart may correspond to a module, a segment or a code containing one or more executable instructions implementing one or more logical functions, or to a part thereof. In some cases, functions described by blocks may be executed in an order different from the listed order. For example, two blocks listed in sequence may be executed at the same time or executed in reverse order.

In the description, the word "unit," "module," or the like may refer to a software component or hardware component such as a field-programmable gate array (FPGA) or an application-specific integrated circuit (ASIC) capable of carrying out a function or an operation. However, "unit" or the like is not limited to hardware or software. A unit or the like may be configured so as to reside in an addressable storage medium or to drive one or more processors. Units or the like may refer to software components, object-oriented software components, class components, task components, processes, functions, attributes, procedures, subroutines, program code segments, drivers, firmware, microcode, circuits, data, databases, data structures, tables, arrays, or variables. A function provided by a component and unit may be a combination of smaller components and units, and it may be combined with others to compose large components and units. Components and units may be configured to drive a device or one or more processors in a secure multimedia card. In a certain embodiment, a unit or the like may include at least one processor.

FIG. 1A shows the structure of an amplifier according to the related art.

Referring to FIG. 1A, in the related art, the amplifier may include a first resistor 110 connected to the input terminal and a second resistor 120 connected to the output terminal. The input signal $V_i$ input to the input terminal may be amplified through the first resistor 110 and the second resistor 120 and appear as an output signal $V_o$ at the output terminal. The gain of the amplifier may be determined based on the ratio between the resistance value of the first resistor 110 and the resistance value of the second resistor 120.

In the related art, a switch may be electrically connected to one end of the second resistor 120 to turn the amplifier on or off or to change the gain of the amplifier. This switch may be implemented using a complementary metal-oxide semiconductor (CMOS) in which a p-type metal-oxide-semiconductor (PMOS) 130 and an n-type metal-oxide-semiconductor (NMOS) 140 are combined.

According to the related art, when $V_1$ is higher than the threshold voltage of the metal-oxide-semiconductor field-effect transistor (MOSFET), both the PMOS 130 and the NMOS 140 may be turned on. When $V_1$ is lower than the threshold voltage of the MOSFET, both the PMOS 130 and the NMOS 140 may be turned off. That is, turn-on/turn-off control of the switch including the PMOS 130 and the NMOS 140 may be achieved by controlling the $V_1$ voltage.

Figure 1B:
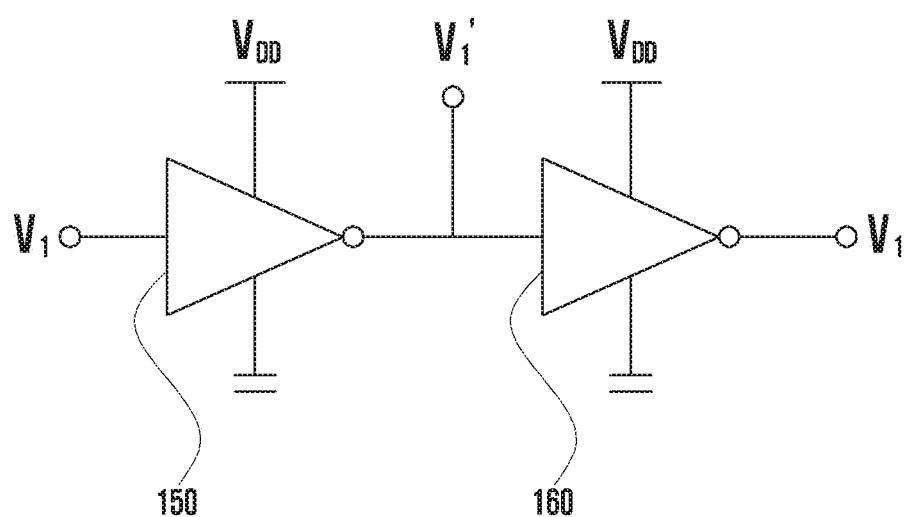
FIG. 1B shows a switch control processor for controlling the switch of an amplifier according to the related art.

FIG. 1B shows a switch control processor for controlling the switch of an amplifier according to the related art.

Referring to FIG. 1B, in the related art, the PMOS may be turned on when the voltage applied to the gate terminal is less than the threshold voltage, and the NMOS may be turned on when the voltage applied to the gate terminal exceeds the threshold voltage. Hence, the switch control processor for controlling the switch of the amplifier according to the related art may be configured as shown in FIG. 2B.

In the related art, the first inverter 150 may receive an input signal $V_1$ as input to the switch control processor and produce an output signal $V_1'$. The signal $V_1'$ output by the first inverter 150 may be supplied to the gate terminal of the PMOS constituting the switch. The signal $V_1'$ output by the first inverter 150 may be input to the second inverter 160, and the second inverter 160 may produce an output signal $V_1$. The signal $V_1$ output by the second inverter 160 may be supplied to the gate terminal of the NMOS constituting the switch.

In the related art, due to the characteristic of the MOSFETs, parasitic capacitance components may be generated between the gate terminal and the source terminal of the PMOS, between the gate terminal and the drain terminal of the PMOS, between the source terminal and the bulk terminal of the PMOS, and between the drain terminal and the bulk terminal of the PMOS.

According to the related art, when the amplifier operates in a low frequency band, as the impedance of the parasitic capacitance components is sufficiently high, the fundamental signal to be amplified may not flow through the parasitic capacitance even when the switch is turned on. However, when the amplifier operates in a very high frequency band such as the 5G mobile communication system, as the impedance value of the parasitic capacitance components becomes low, the fundamental signal to be amplified may flow through the parasitic capacitance when the switch is turned on. That is, in the related art, as a portion of the fundamental signal to be amplified may not flow to the output terminal of the amplifier but may flow through the parasitic capacitance, the gain of the amplifier can be reduced particularly in a high frequency range.

Figure 2A:
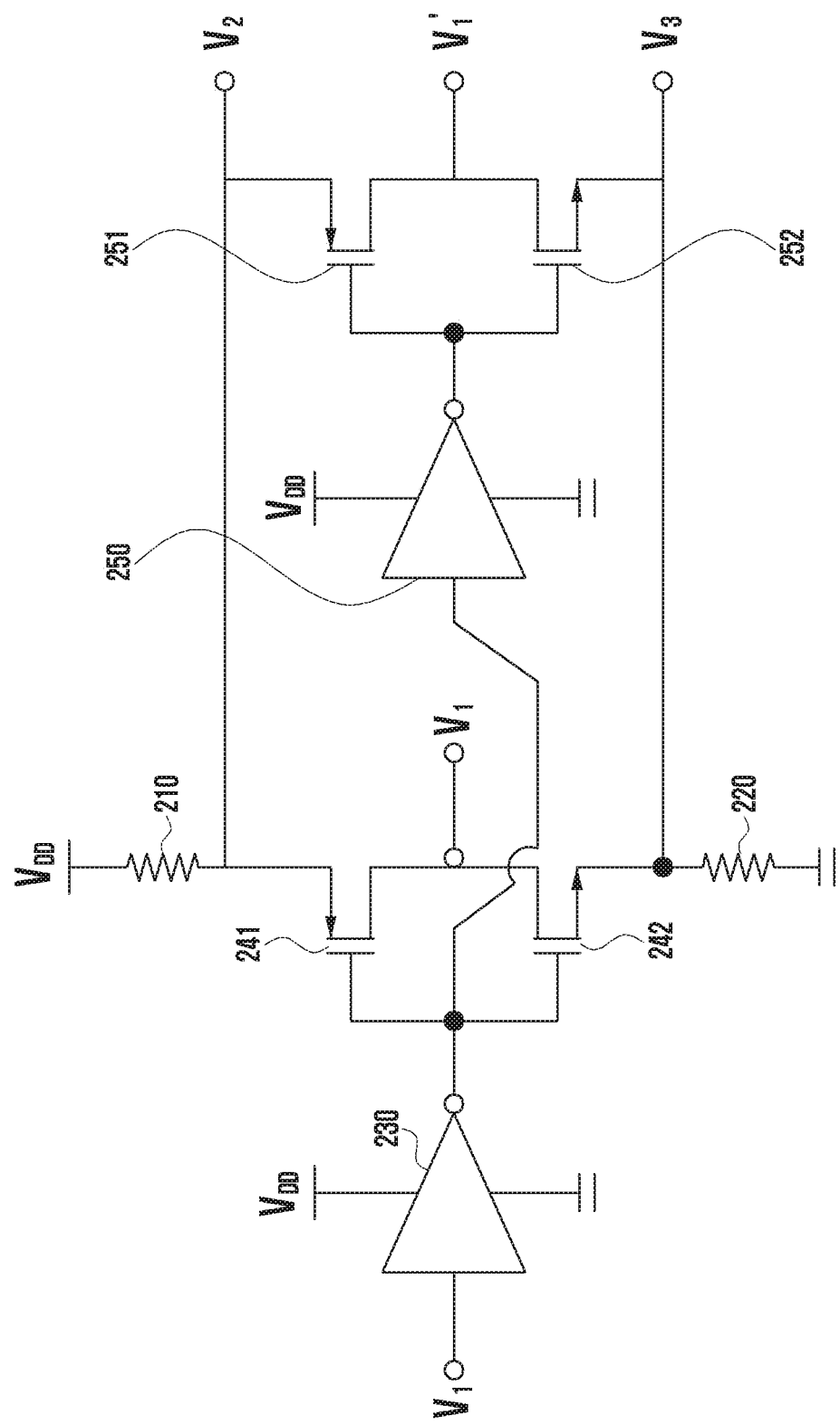
FIG. 2A shows a switch control processor according to an embodiment of the disclosure.
Figure 2B:
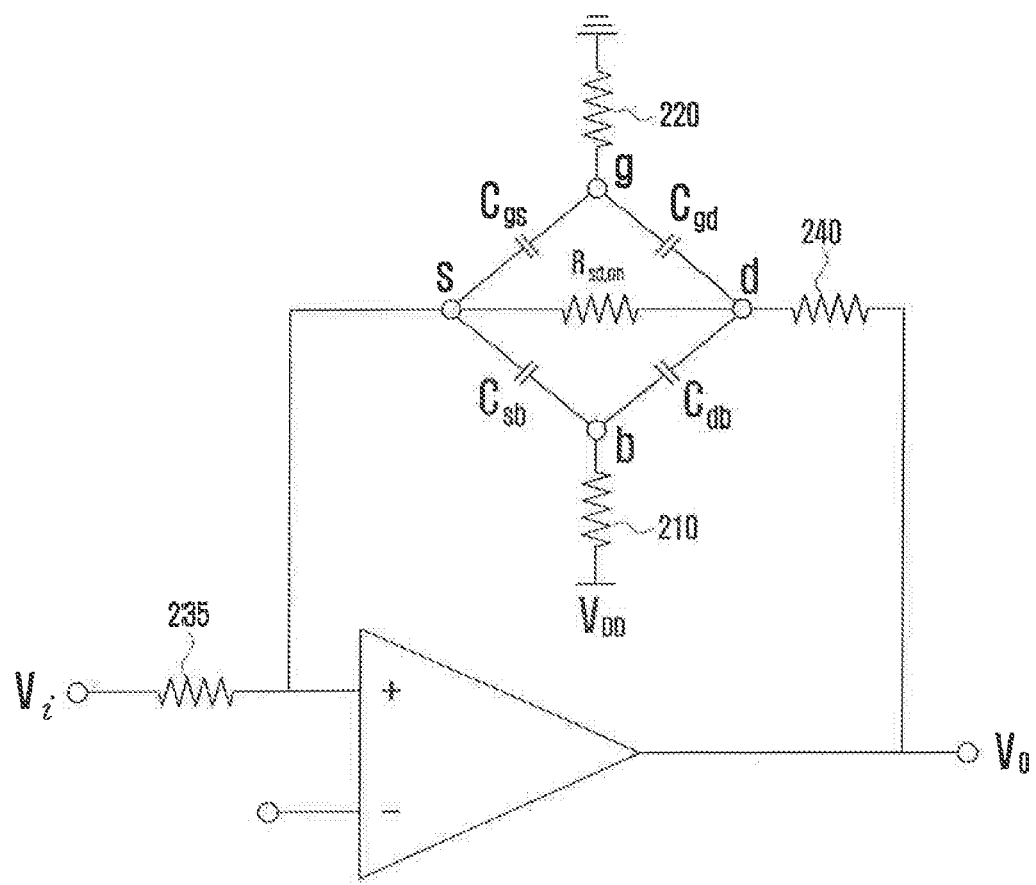
FIG. 2B illustrates an amplifier according to an embodiment of the disclosure.

FIG. 2A shows a switch control processor according to an embodiment of the disclosure.

Referring to FIG. 2A, in one embodiment, the switch control processor may include a first inverter 230 for receiving a control signal $V_1$, a first CMOS where the gate terminal of the first PMOS 241 and the gate terminal of the first NMOS 242 are electrically connected to the output terminal of the first inverter 230, a second inverter 250 electrically connected to the output terminal of the first inverter 230, a second CMOS where the gate terminal of the second PMOS 251 and the gate terminal of the second NMOS 252 are electrically connected to the output terminal of the second inverter 250, a first impedance 210 electrically connected to the source terminal of the first PMOS 241 and the source terminal of the second PMOS 251 and having an impedance value higher than a first threshold value, and a second impedance 220 electrically connected to the source terminal of the first NMOS 242 and the source terminal of the second NMOS 252 and having an impedance value higher than the first threshold value.

In one embodiment, when the control signal $V_1$ is set to $V_{DD}$, the output signal of the first inverter 230 may be zero. When the output signal of the first inverter 230 is 0, the first PMOS 241 may be turned on and the first NMOS 242 may be turned off. When only the first PMOS 241 is turned on, the output signal at the output terminal of the first CMOS may be set to $V_{DD}$. The output signal from the output terminal of the first CMOS may be used as a control signal for the gate terminal of the NMOS constituting the switch. That is, when $V_1$ is set to $V_{DD}$, as the control signal supplied to the gate terminal of the NMOS constituting the switch is $V_{DD}$, the NMOS may be turned on.

In one embodiment, when the NMOS constituting the switch is turned on, the gate terminal of the NMOS may be electrically connected to the first impedance 210 having an impedance value higher than the first threshold value. In various embodiments, the first impedance 210 may include a resistor and an inductor.

In one embodiment, the first impedance 210 having a high impedance value may prevent a current from flowing through the parasitic capacitance between the gate terminal and the source terminal of the NMOS constituting the switch and through the parasitic capacitance between the gate terminal and the drain terminal of the NMOS constituting the switch. (The blocking effect of the current flowing through the parasitic capacitance will be described later with reference to FIG. 2B.)

In one embodiment, when the output signal from the first inverter 230 is 0, the output signal from the second inverter 250 may be $V_{DD}$. When the output signal of the second inverter 250 is $V_{DD}$, the second PMOS 251 may be turned off and the second NMOS 252 may be turned on. When only the second NMOS 252 is turned on, the output signal from the output terminal of the second CMOS may be zero. The output signal from the output terminal of the second CMOS may be used as a control signal for the gate terminal of the PMOS constituting the switch. That is, when $V_1$ is set to $V_{DD}$, as the control signal supplied to the gate terminal of the NMOS constituting the switch is 0, the PMOS may be turned on.

In one embodiment, when the PMOS constituting the switch is turned on, the gate terminal of the PMOS may be electrically connected to the second impedance 220 having an impedance value higher than the first threshold value. In various embodiments, the second impedance 220 may include a resistor and an inductor.

In one embodiment, the second impedance 220 having a high impedance value may prevent a current from flowing through the parasitic capacitance between the gate terminal and the source terminal of the PMOS constituting the switch and through the parasitic capacitance between the gate terminal and the drain terminal of the PMOS constituting the switch.

In one embodiment, the bulk terminal of the PMOS constituting the switch may be electrically connected to the source terminal of the first PMOS 241 or the source terminal of the second PMOS 251. The bulk terminal of the PMOS constituting the switch may be electrically connected to the first impedance 210. Hence, the first impedance 210 may prevent a current from flowing through the parasitic capacitance between the bulk terminal and the source terminal of the PMOS constituting the switch and through the parasitic capacitance between the bulk terminal and the drain terminal of the PMOS constituting the switch.

In one embodiment, the bulk terminal of the NMOS constituting the switch may be electrically connected to the source terminal of the first NMOS 242 or the source terminal of the second NMOS 252. The bulk terminal of the NMOS constituting the switch may be electrically connected to the second impedance 220. Hence, the second impedance 220 may prevent a current from flowing through the parasitic capacitance between the bulk terminal and the source terminal of the NMOS constituting the switch and through the parasitic capacitance between the bulk terminal and the drain terminal of the NMOS constituting the switch.

In one embodiment, the bulk terminal of the PMOS constituting the switch may be electrically connected to the $V_2$ node of the switch control processor, and the bulk terminal of the NMOS constituting the switch may be electrically connected to the $V_3$ node of the switch control processor.

FIG. 2B illustrates an amplifier according to an embodiment of the disclosure.

More specifically, FIG. 2B illustrates an equivalent circuit when the MOSFET constituting the switch is turned on in the amplifier including the switch control processor shown in FIG. 2A.

Referring to FIG. 2A, the switch is a CMOS including a PMOS and an NMOS. FIG. 2B illustrates a case where the switch includes only one PMOS, to avoid repeated descriptions.

Referring to FIG. 2B, in one embodiment, when the switch is turned on, the source terminal s and the drain terminal d of the PMOS constituting the switch may be electrically connected through the resistor $R_{sd,on}$. For example, the resistor $R_{sd,on}$ may be generated between the drain terminal and the source terminal when the PMOS is turned on, and may have a low impedance value. Due to the characteristics of the MOSFET, a first parasitic capacitance component $C_{gs}$ may be generated between the gate terminal and the source terminal, a second parasitic capacitance component Co. may be generated between the gate terminal and the drain terminal, a third parasitic capacitance component $C_{sb}$ may be generated between the source terminal and the bulk terminal, and a fourth parasitic capacitance component $C_{db}$ may be generated between the drain terminal and the bulk terminal.

In one embodiment, the higher the operating frequency band of the amplifier, the lower the impedance value of the parasitic capacitance component. When the operating frequency band of the amplifier is sufficiently high such that the impedance value of the parasitic capacitor is less than or equal to a preset threshold, a portion of the fundamental signal to be amplified may flow through the parasitic capacitor. In one embodiment, the fundamental signal may be amplified based on the ratio between the value of a first resistor 235 at the input stage of the amplifier and the value of a second resistor 240 at the output stage of the amplifier.

In one embodiment, a first impedance 210 having a high impedance value may be electrically connected to the bulk terminal of the MOSFET, and a second impedance 220 having a high impedance value may be electrically connected to the gate terminal of the MOSFET. Although current flows through the first parasitic capacitance component $C_{gs}$ and the second parasitic capacitance component $C_{gd}$, as the second impedance 220 having a high impedance value is connected to the gate terminal of the PMOS constituting the switch, the fundamental signal to be amplified may not flow through the gate terminal. Similarly, although current flows through the third parasitic capacitance component $C_{sb}$ and the fourth parasitic capacitance component $C_{db}$, as the first impedance 210 having a high impedance value is connected to the bulk terminal of the PMOS constituting the switch, the fundamental signal to be amplified may not flow through the bulk terminal.

In other words, according to an embodiment of the disclosure, the gain of the amplifier may be increased by blocking the current flowing through the parasitic capacitor of the MOSFET constituting the switch by use of the first impedance 210 having a high impedance value and the second impedance 220 having a high impedance value.

In one embodiment, the first impedance 210 and the second impedance 220 may include a resistor or an inductor. When the first impedance 210 and the second impedance 220 comprise a resistor having a high impedance value, the current flowing through the parasitic capacitor of the MOSFET may be blocked regardless of the operating frequency of the amplifier. When the first impedance 210 and the second impedance 220 comprise an inductor, as the impedance value of the inductor increases with the increasing operating frequency of the amplifier, the current flowing through the parasitic capacitor of the MOSFET can be blocked.

Figure 3A:
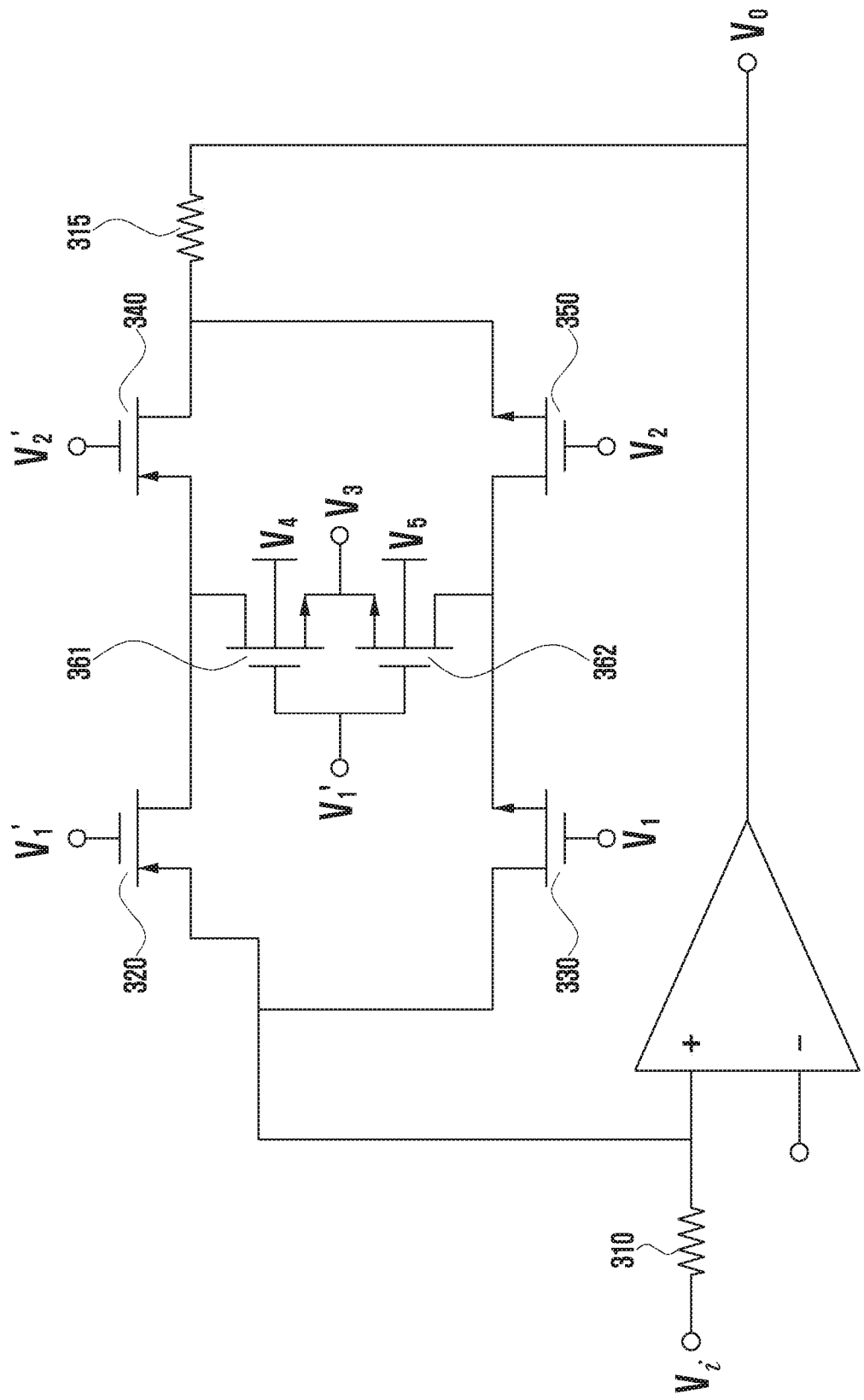
FIG. 3A illustrates an amplifier including a two-stage switch and a short-circuit switch according to an embodiment of the disclosure.

FIG. 3A illustrates an amplifier including a two-stage switch and a short-circuit switch according to an embodiment of the disclosure.

Referring to FIG. 3A, in one embodiment, when increasing the impedance of the gate and bulk terminals of the MOSFETs constituting the switch, the amount of amplifier feedback signal through the switch that is turned off may be increased. That is, the amount of the output signal fed back from the output terminal of the amplifier to the input terminal of the amplifier can increase. When the amount of the amplifier feedback signal increases, the bandwidth of the amplifier may be reduced due to the Miller effect.

In one embodiment, to prevent the bandwidth reduction effect due to the increased feedback signal through the turned-off switch, as shown in FIG. 3A, the switch may be configured in two stages, and a short-circuit switch may be disposed between the two switches. In an embodiment, a two-stage switch may be disposed at the output terminal of the amplifier including a first resistor 310 at the input terminal and a second resistor 315 at the output terminal. In various embodiments, the two-stage switch and the short-circuit switch may be controlled in a suitable manner so that the feedback signal of the amplifier can flow through the short-circuit switch.

In one embodiment, the two-stage switch constituting the amplifier may be configured by connecting a first switch, which includes a first CMOS based on a first PMOS 320 and a first NMOS 330, and a second switch, which includes a second CMOS based on a second PMOS 340 and a second NMOS 350, in series. The first switch and the second switch may operate in a manner identical or similar to that of the switch described with reference to FIG. 1A. For example, when $V_1$ and $V_2$ are set to $V_{DD}$, all of the first PMOS 320, the first NMOS 330, the second PMOS 340, and the second NMOS 350 may be turned on.

In one embodiment, the short-circuit switch connected between the first switch and the second switch may include a third NMOS 361 and a fourth NMOS 362. When the first switch and the second switch are turned on (i.e., when $V_1$ and $V_2$ are set to $V_{DD}$), both the third NMOS 361 and the fourth NMOS 362 may be turned off.

In one embodiment, when the first switch and the second switch are turned off (i.e., when $V_1$ and $V_2$ are set to 0), both the third NMOS 361 and the fourth NMOS 362 may be turned on. Even when the first switch and the second switch are turned off, the feedback signal may flow in the amplifier through the parasitic capacitor of the MOSFET. Most of the feedback signal passing through the second switch may flow to the short-circuit switch having a low impedance value. That is, according to an embodiment of the disclosure, most of the feedback signal passing through the second switch flows through the short-circuit switch, which prevents reduction of the bandwidth of the amplifier due to the feedback signal flowing to the input stage of the amplifier.

Figure 3B:
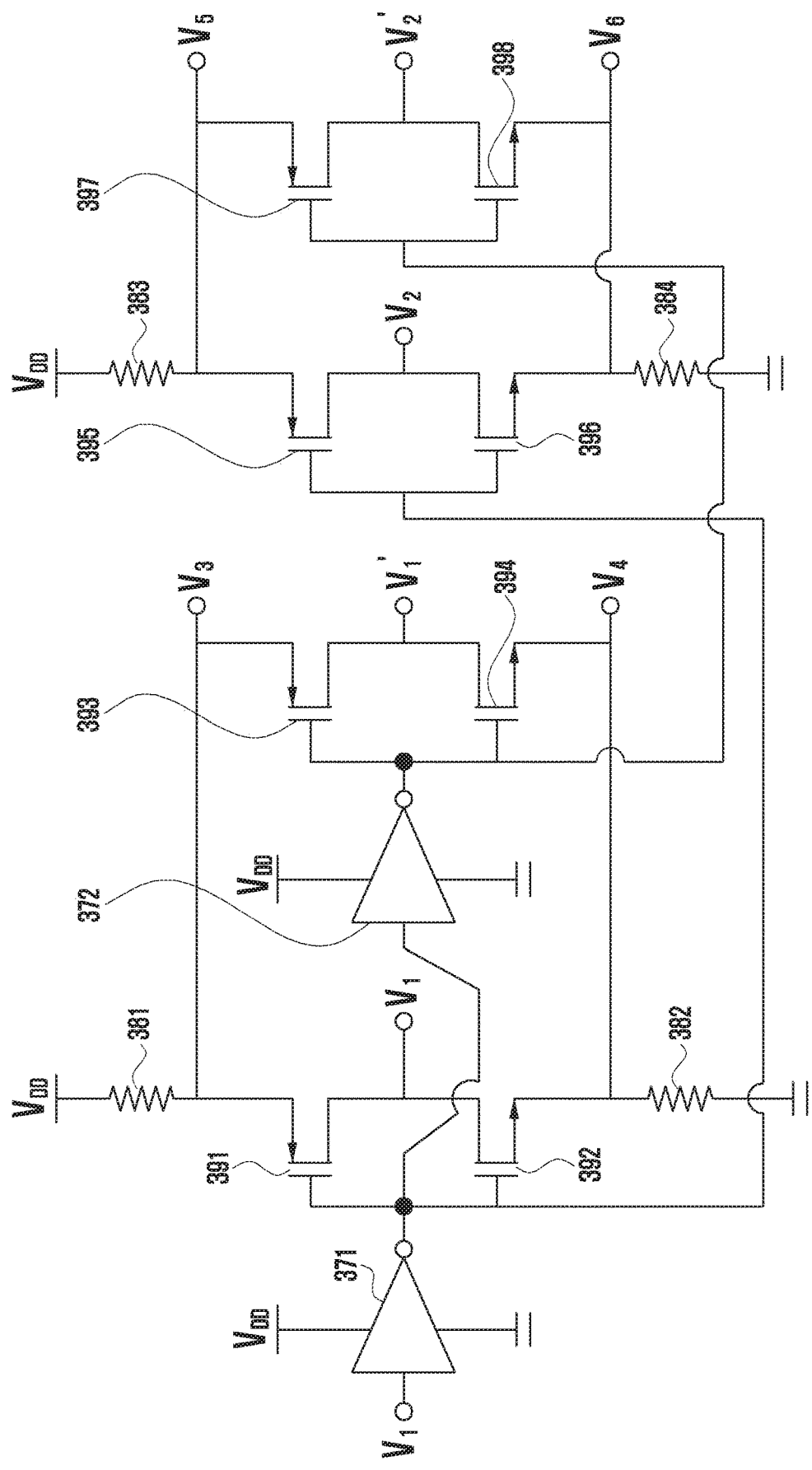
FIG. 3B illustrates a switch control processor for controlling the two-stage switch and the short-circuit switch according to an embodiment of the disclosure.

FIG. 3B illustrates a switch control processor for controlling the two-stage switch according to an embodiment of the disclosure.

Referring to FIG. 3B, in one embodiment, the switch control processor may be divided into a first switch control processor for controlling the first switch constituting the two-stage switch and a second switch control processor for controlling the second switch. The first switch control processor for controlling the first switch may include a first inverter 371 for receiving a control signal $V_1$, a first CMOS where the gate terminal of a first PMOS 391 and the gate terminal of a first NMOS 392 are electrically connected to the output terminal of the first inverter 371, a second inverter 372 electrically connected to the output terminal of the first inverter 371, a second CMOS where the gate terminal of a second PMOS 393 and the gate terminal of a second NMOS 394 are electrically connected to the output terminal of the second inverter 372, a first impedance 381 electrically connected to the source terminal of the first PMOS 391 and the source terminal of the second PMOS 393 and having an impedance value higher than a first threshold value, and a second impedance 382 electrically connected to the source terminal of the first NMOS 392 and the source terminal of the second NMOS 394 and having an impedance value higher than the first threshold value.

In one embodiment, when the control signal $V_1$ is set to $V_{DD}$, the output signal of the first inverter 371 may be zero. When the output signal of the first inverter 371 is 0, the first PMOS 391 may be turned on and the first NMOS 392 may be turned off. When only the first PMOS 391 is turned on, the output signal at the output terminal of the first CMOS may be $V_{DD}$. The output signal at the output terminal of the first CMOS may be used as a control signal for the gate terminal of the NMOS constituting the switch. That is, when $V_1$ is set to $V_{DD}$, as the control signal supplied to the gate terminal of the NMOS constituting the switch is $V_{DD}$, the NMOS may be turned on.

In one embodiment, when the NMOS constituting the switch is turned on, the gate terminal of the NMOS may be electrically connected to the first impedance 381 having an impedance value higher than the first threshold value. The first impedance 381 may include a resistor and an inductor.

In one embodiment, when the output signal of the first inverter 371 is set to 0, the output signal of the second inverter 372 may be $V_{DD}$. When the output signal of the second inverter 372 is $V_{DD}$, the second PMOS 393 may be turned off and the second NMOS 394 may be turned on. When only the second NMOS 394 is turned on, the output signal at the output terminal of the second CMOS may be zero. The output signal at the output terminal of the second CMOS may be used as a control signal for the gate terminal of the PMOS constituting the switch. That is, when $V_1$ is set to $V_{DD}$, as the control signal supplied to the gate terminal of the NMOS constituting the switch is 0, the PMOS may be turned on.

In one embodiment, when the PMOS constituting the switch is turned on, the gate terminal of the PMOS may be electrically connected to the second impedance 382 having an impedance value higher than the first threshold value. The second impedance 382 may include a resistor and an inductor.

In one embodiment, the bulk terminal of the PMOS constituting the first switch of the two-stage switch may be electrically connected to the source terminal of the first PMOS 391 or the source terminal ($V_3$ node) of the second PMOS in the switch control processor, and the bulk terminal of the NMOS constituting the first switch may be electrically connected to the source terminal of the first NMOS 392 or the source terminal ($V_4$ node) of the second NMOS 394.

In one embodiment, the second switch control processor for controlling the second switch may include a third CMOS where the gate terminal of a third PMOS 395 and the gate terminal of a third NMOS 396 are electrically connected to the output terminal of the first inverter 371, a fourth CMOS where the gate terminal of a fourth PMOS 397 and the gate terminal of a fourth NMOS 398 are electrically connected to the output terminal of the second inverter 372, a third impedance 383 electrically connected to the source terminal of the third PMOS 395 and the source terminal of the fourth PMOS 397 and having an impedance value higher than the first threshold value, and a fourth impedance 384 electrically connected to the source terminal of the third NMOS 396 and the source terminal of the fourth NMOS 398 and having an impedance value higher than the first threshold value. The bulk terminal of the PMOS constituting the second switch may be electrically connected to the source terminal of the third PMOS 395 or the source terminal ($V_5$ node) of the fourth PMOS 397, and the bulk terminal of the NMOS constituting the second switch may be electrically connected to the source terminal of the third NMOS 396 or the source terminal ($V_6$ node) of the fourth NMOS 398.

In one embodiment, the operation of the first switch control processor may be the same as or similar to the operation of the switch control processor described with reference to FIG. 2A. The operation of the second switch control processor may be the same as or similar to the operation of the first switch control processor described above.

Meanwhile, the circuit diagrams shown in FIGS. 3A and 3B are only an embodiment of the disclosure, and the scope of the disclosure should not be limited to the circuit diagrams shown in FIGS. 3A and 3B.

Figure 4:
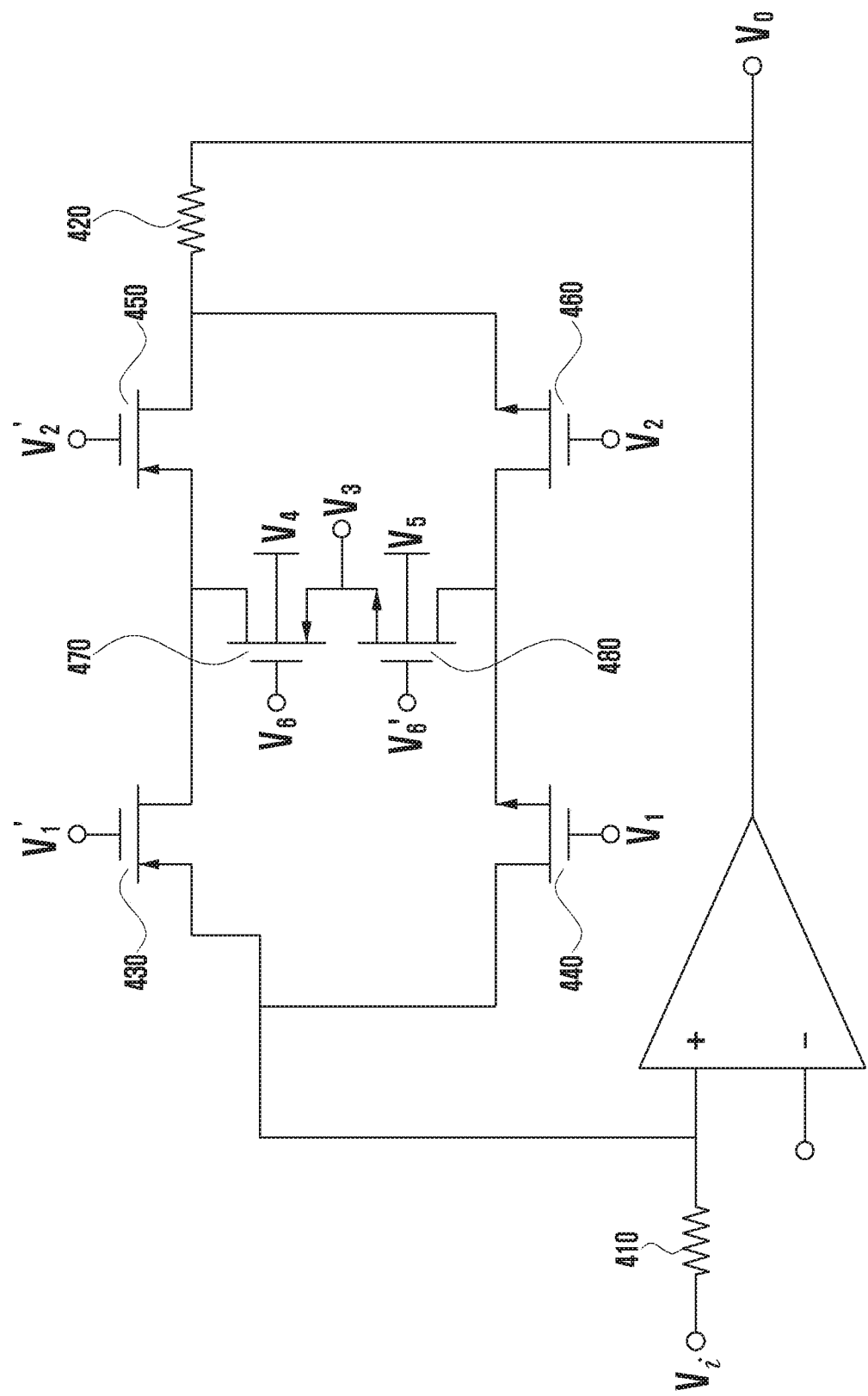
FIG. 4 illustrates a case where the short-circuit switch includes a p-type metal-oxide-semiconductor (PMOS) and an n-type metal-oxide-semiconductor (NMOS) according to an embodiment of the disclosure.

FIG. 4 illustrates a case where the short-circuit switch includes a PMOS and an NMOS according to an embodiment of the disclosure.

Referring to FIG. 4, in one embodiment, a two-stage switch may be disposed at the output terminal of the amplifier including a first resistor 410 at the input terminal and a second resistor 420 at the output terminal. The two-stage switch may include a first switch including a first CMOS based on a first PMOS 430 and a first NMOS 440, and a second switch including a second CMOS based on a second PMOS 450 and a second NMOS 460.

In one embodiment, a short-circuit switch including a third PMOS 470 and a third NMOS 480 may be disposed between the first switch and the second switch. When $V_1$ and $V_2$ are set to $V_{DD}$ (i.e., when the first switch and the second switch are turned on), $V_6$ may be $V_{DD}$. In other words, when the first switch and the second switch are turned on, both the third PMOS 470 and the third NMOS 480 may be turned off.

In one embodiment, When $V_1$ and $V_2$ are set to 0 (i.e., when the first switch and the second switch are turned off), $V_6$ may be 0. In other words, when the first switch and the second switch are turned off, both the third PMOS 470 and the third NMOS 480 may be turned on. The $V_3$ node, which is the source terminals of the third PMOS 470 and the third NMOS 480, may have an impedance value lower than a preset threshold. Consequently, most of the feedback signal in the amplifier can flow through the short-circuit switch with a low impedance value.

In one embodiment, the voltage of the bulk terminal of the third PMOS 470 may be set to $V_4$, and the voltage of the bulk terminal of the third NMOS 480 may be set to $V_5$. The bulk terminals of the third PMOS and the third NMOS constituting the short-circuit switch may be electrically connected to an impedance having a high impedance value as shown in FIG. 2B.

Figure 5:
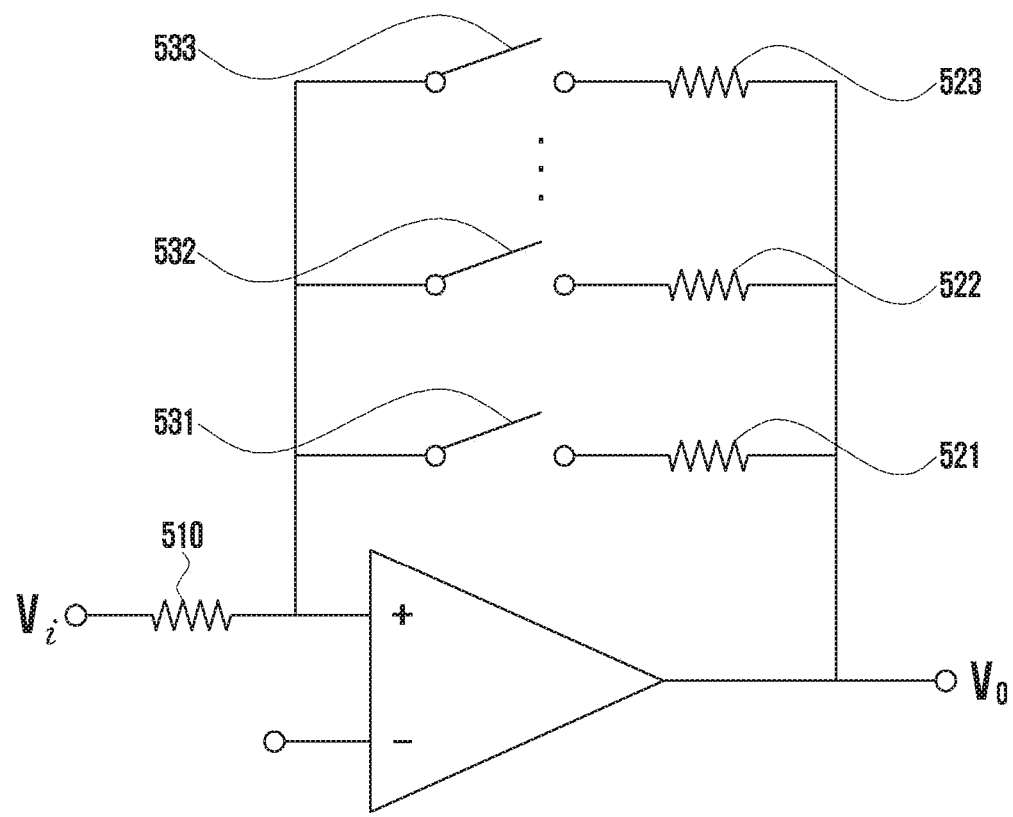
FIG. 5 illustrates a variable gain amplifier according to an embodiment of the disclosure.

FIG. 5 illustrates a variable gain amplifier according to an embodiment of the disclosure.

Referring to FIG. 5, in one embodiment, the amplifier may include a first resistor 510 at the input terminal. To vary the gain of the amplifier, a plurality of resistors 521, 522, and 523 may be connected in parallel to the output terminal, and switches 531, 532, and 533 corresponding respectively to the resistors 521, 522, and 523 may be disposed. The gain of the amplifier may be changed by controlling the turning on/off of each switch.

In one embodiment, when the switches 531, 532, and 533 are implemented using MOSFETs, the gain of the amplifier may be reduced due to the parasitic capacitance components of the switches connected in parallel as described above. Accordingly, the disclosure provides a switch control processor to prevent reduction of the gain of the amplifier due to the switch. The switch and switch control processor of the disclosure may be applied to each of the switches 531, 532 and 533 constituting the amplifier.

In addition, according to the disclosure, when the switch is configured as a two-stage switch in which a first switch and a second switch are connected in series and a short-circuit switch is placed between the first switch and the second switch, it is possible to reduce the amount of the feedback signal through the turned-off switch. Hence, the bandwidth of the amplifier can be increased by reducing the feedback signal that affects the input stage of the amplifier through the turned-off switch.

According to various embodiments of the disclosure, an amplifier may include: a first resistor electrically connected to the input terminal; a second resistor electrically connected to the output terminal; a switch including a MOSFET and electrically connected to one end of the second resistor; and a switch control processor configured to electrically connect the gate terminal of the MOSFET constituting the switch and the bulk terminal of the MOSFET constituting the switch to an impedance having an impedance value higher than a preset first threshold.

In one embodiment, the switch may include a CMOS, and the switch control processor may include: a first impedance electrically connected to the gate terminal and the bulk terminal of the PMOS constituting the CMOS and having an impedance value higher than the first threshold; and a second impedance electrically connected to the gate terminal and the bulk terminal of the NMOS constituting the CMOS and having an impedance value higher than the first threshold.

In one embodiment, the switch control processor may include: a first inverter for receiving a control signal; a first CMOS in which the gate terminal of a first PMOS and the gate terminal of a first NMOS are electrically connected to the output terminal of the first inverter; a second inverter electrically connected to the output terminal of the first inverter; a second CMOS in which the gate terminal of a second PMOS and the gate terminal of a second NMOS are electrically connected to the output terminal of the second inverter; a first impedance electrically connected to the source terminal of the first PMOS and the source terminal of the second PMOS and having an impedance value higher than the first threshold; and a second impedance electrically connected to the source terminal of the first NMOS and the source terminal of the second NMOS and having an impedance value higher than the first threshold.

In one embodiment, the bulk terminal of the PMOS constituting the switch may be electrically connected to the source terminal of the first PMOS or the source terminal of the second PMOS, and the bulk terminal of the NMOS constituting the switch may be electrically connected to the source terminal of the first NMOS or the source terminal of the second NMOS.

In one embodiment, the gate terminal of the PMOS constituting the switch may be electrically connected to the output terminal of the first CMOS, and the gate terminal of the NMOS constituting the switch may be electrically connected to the output terminal of the second CMOS.

In one embodiment, the switch may include a first switch including a CMOS and electrically connected to one end of the second resistor, and a second switch including a CMOS and electrically connected to one end of the first switch.

In one embodiment, the switch control processor may include: a first inverter for receiving a control signal; a first CMOS in which the gate terminal of a first PMOS and the gate terminal of a first NMOS are electrically connected to the output terminal of the first inverter; a second inverter electrically connected to the output terminal of the first inverter; a second CMOS in which the gate terminal of a second PMOS and the gate terminal of a second NMOS are electrically connected to the output terminal of the second inverter; a first impedance electrically connected to the source terminal of the first PMOS and the source terminal of the second PMOS and having an impedance value higher than the first threshold; a second impedance electrically connected to the source terminal of the first NMOS and the source terminal of the second NMOS and having an impedance value higher than the first threshold; a third CMOS in which the gate terminal of a third PMOS and the gate terminal of a third NMOS are electrically connected to the output terminal of the first inverter; a fourth CMOS in which the gate terminal of a fourth PMOS and the gate terminal of a fourth NMOS are electrically connected to the output terminal of the second inverter; a third impedance electrically connected to the source terminal of the third PMOS and the source terminal of the fourth PMOS and having an impedance value higher than the first threshold; and a fourth impedance electrically connected to the source terminal of the third NMOS and the source terminal of the fourth NMOS and having an impedance value higher than the first threshold.

In one embodiment, the bulk terminal of the PMOS constituting the first switch may be electrically connected to the source terminal of the first PMOS or the source terminal of the second PMOS, the bulk terminal of the NMOS constituting the first switch may be electrically connected to the source terminal of the first NMOS or the source terminal of the second NMOS, the bulk terminal of the PMOS constituting the second switch may be electrically connected to the source terminal of the third PMOS or the source terminal of the fourth PMOS, and the bulk terminal of the NMOS constituting the second switch may be electrically connected to the source terminal of the third NMOS or the source terminal of the fourth NMOS.

In one embodiment, the amplifier may further include a third switch having an impedance value lower than a preset second threshold between the first switch and the second switch.

In one embodiment, the third switch may include: a fifth PMOS having an impedance value lower than the second threshold and whose drain terminal is electrically connected between the PMOS constituting the first switch and the PMOS constituting the second switch; and a fifth NMOS having an impedance value lower than the second threshold and whose drain terminal is electrically connected between the NMOS constituting the first switch and the NMOS constituting the second switch.

According to various embodiments of the disclosure, an electronic device may include an amplifier. The amplifier may include: a first resistor electrically connected to the input terminal; a second resistor electrically connected to the output terminal; a switch including a MOSFET and electrically connected to one end of the second resistor; and a switch control processor configured to electrically connect the gate terminal of the MOSFET constituting the switch and the bulk terminal of the MOSFET constituting the switch to an impedance having an impedance value higher than a preset first threshold.

In one embodiment, the switch may include a complementary metal-oxide semiconductor (CMOS), and the switch control processor may include: a first impedance electrically connected to the gate terminal and the bulk terminal of the PMOS constituting the CMOS and having an impedance value higher than the first threshold; and a second impedance electrically connected to the gate terminal and the bulk terminal of the NMOS constituting the CMOS and having an impedance value higher than the first threshold.

In one embodiment, the switch control processor may include: a first inverter for receiving a control signal; a first CMOS in which the gate terminal of a first PMOS and the gate terminal of a first NMOS are electrically connected to the output terminal of the first inverter; a second inverter electrically connected to the output terminal of the first inverter; a second CMOS in which the gate terminal of a second PMOS and the gate terminal of a second NMOS are electrically connected to the output terminal of the second inverter; a first impedance electrically connected to the source terminal of the first PMOS and the source terminal of the second PMOS and having an impedance value higher than the first threshold; and a second impedance electrically connected to the source terminal of the first NMOS and the source terminal of the second NMOS and having an impedance value higher than the first threshold.

In one embodiment, the bulk terminal of the PMOS constituting the switch may be electrically connected to the source terminal of the first PMOS or the source terminal of the second PMOS, and the bulk terminal of the NMOS constituting the switch may be electrically connected to the source terminal of the first NMOS or the source terminal of the second NMOS.

In one embodiment, the gate terminal of the PMOS constituting the switch may be electrically connected to the output terminal of the first CMOS, and the gate terminal of the NMOS constituting the switch may be electrically connected to the output terminal of the second CMOS.

In one embodiment, the switch may include a first switch including a CMOS and electrically connected to one end of the second resistor, and a second switch including a CMOS and electrically connected to one end of the first switch.

In one embodiment, the switch control processor may include: a first inverter for receiving a control signal; a first CMOS in which the gate terminal of a first PMOS and the gate terminal of a first NMOS are electrically connected to the output terminal of the first inverter; a second inverter electrically connected to the output terminal of the first inverter; a second CMOS in which the gate terminal of a second PMOS and the gate terminal of a second NMOS are electrically connected to the output terminal of the second inverter; a first impedance electrically connected to the source terminal of the first PMOS and the source terminal of the second PMOS and having an impedance value higher than the first threshold; a second impedance electrically connected to the source terminal of the first NMOS and the source terminal of the second NMOS and having an impedance value higher than the first threshold; a third CMOS in which the gate terminal of a third PMOS and the gate terminal of a third NMOS are electrically connected to the output terminal of the first inverter; a fourth CMOS in which the gate terminal of a fourth PMOS and the gate terminal of a fourth NMOS are electrically connected to the output terminal of the second inverter; a third impedance electrically connected to the source terminal of the third PMOS and the source terminal of the fourth PMOS and having an impedance value higher than the first threshold; and a fourth impedance electrically connected to the source terminal of the third NMOS and the source terminal of the fourth NMOS and having an impedance value higher than the first threshold.

In one embodiment, the bulk terminal of the PMOS constituting the first switch may be electrically connected to the source terminal of the first PMOS or the source terminal of the second PMOS, the bulk terminal of the NMOS constituting the first switch may be electrically connected to the source terminal of the first NMOS or the source terminal of the second NMOS, the bulk terminal of the PMOS constituting the second switch may be electrically connected to the source terminal of the third PMOS or the source terminal of the fourth PMOS, and the bulk terminal of the NMOS constituting the second switch may be electrically connected to the source terminal of the third NMOS or the source terminal of the fourth NMOS.

In one embodiment, the amplifier may further include a third switch having an impedance value lower than a preset second threshold between the first switch and the second switch.

In one embodiment, the third switch may include: a fifth PMOS having an impedance value lower than the second threshold and whose drain terminal is electrically connected between the PMOS constituting the first switch and the PMOS constituting the second switch; and a fifth NMOS having an impedance value lower than the second threshold and whose drain terminal is electrically connected between the NMOS constituting the first switch and the NMOS constituting the second switch.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An amplifier for amplifying an input signal, the amplifier comprising:
   a first resistor electrically connected to an input terminal;
   a second resistor electrically connected to an output terminal;
   a switch including a complementary metal-oxide-semiconductor (CMOS) and electrically connected to one end of the second resistor; and
   a switch control processor comprising a first impedance electrically connected to a gate terminal of a p-type metal-oxide-semiconductor (PMOS) constituting the switch and a bulk terminal of an n-type metal-oxide-semiconductor (NMOS) constituting the switch, and a second impedance electrically connected to a bulk terminal of the PMOS and a gate terminal of the NMOS,
   wherein the first impedance and the second impedance correspond to an impedance value higher than a preset first threshold.

2. The amplifier of claim 1,
   wherein the first impedance comprises a first register and a first inductor, and
   wherein the second impedance comprises a second register and a second inductor.

3. The amplifier of claim 1, wherein the switch control processor comprises:
   a first inverter configured to receive a control signal;
   a first CMOS in which a gate terminal of a first PMOS and a gate terminal of a first NMOS are electrically connected to an output terminal of the first inverter;
   a second inverter electrically connected to the output terminal of the first inverter;
   a second CMOS in which a gate terminal of a second PMOS and a gate terminal of a second NMOS are electrically connected to an output terminal of the second inverter;
   a first impedance electrically connected to a source terminal of the first PMOS and a source terminal of the second PMOS and having an impedance value higher than the first threshold; and
   a second impedance electrically connected to a source terminal of the first NMOS and a source terminal of the second NMOS and having an impedance value higher than the first threshold.

4. The amplifier of claim 3,
   wherein the bulk terminal of the PMOS constituting the CMOS is electrically connected to the source terminal of the first PMOS or the source terminal of the second PMOS, and
   wherein the bulk terminal of the NMOS constituting the CMOS is electrically connected to the source terminal of the first NMOS or the source terminal of the second NMOS.

5. The amplifier of claim 3,
   wherein the gate terminal of the PMOS constituting the CMOS is electrically connected to an output terminal of the first CMOS, and
   wherein the gate terminal of the NMOS constituting the CMOS is electrically connected to an output terminal of the second CMOS.

6. The amplifier of claim 1, wherein the switch comprises:
   a first switch including a first CMOS and electrically connected to one end of the second resistor; and
   a second switch including a second CMOS and electrically connected to one end of the first switch.

7. The amplifier of claim 6, wherein the switch control processor comprises:
   a first inverter configured to receive a control signal;
   a first CMOS in which a gate terminal of a first PMOS and a gate terminal of a first NMOS are electrically connected to an output terminal of the first inverter;
   a second inverter electrically connected to the output terminal of the first inverter;
   a second CMOS in which a gate terminal of a second PMOS and a gate terminal of a second NMOS are electrically connected to an output terminal of the second inverter;
   a first impedance electrically connected to a source terminal of the first PMOS and a source terminal of the second PMOS and having an impedance value higher than the first threshold;
   a second impedance electrically connected to a source terminal of the first NMOS and a source terminal of the second NMOS and having an impedance value higher than the first threshold;
   a third CMOS in which a gate terminal of a third PMOS and a gate terminal of a third NMOS are electrically connected to the output terminal of the first inverter;
   a fourth CMOS in which a gate terminal of a fourth PMOS and a gate terminal of a fourth NMOS are electrically connected to the output terminal of the second inverter;
   a third impedance electrically connected to a source terminal of the third PMOS and a source terminal of the fourth PMOS and having an impedance value higher than the first threshold; and
   a fourth impedance electrically connected to a source terminal of the third NMOS and a source terminal of the fourth NMOS and having an impedance value higher than the first threshold.

8. The amplifier of claim 7,
   wherein a bulk terminal of a PMOS constituting the first switch is electrically connected to the source terminal of the first PMOS or the source terminal of the second PMOS,
   wherein a bulk terminal of an NMOS constituting the first switch is electrically connected to the source terminal of the first NMOS or the source terminal of the second NMOS,
   wherein a bulk terminal of a PMOS constituting the second switch is electrically connected to the source terminal of the third PMOS or the source terminal of the fourth PMOS, and
   wherein a bulk terminal of an NMOS constituting the second switch is electrically connected to the source terminal of the third NMOS or the source terminal of the fourth NMOS.

9. The amplifier of claim 6, further comprising a third switch having an impedance value lower than a preset second threshold between the first switch and the second switch.

10. The amplifier of claim 9, wherein the third switch comprises:
    a fifth PMOS having an impedance value lower than the second threshold, a drain terminal of the fifth PMOS being electrically connected between a PMOS constituting the first switch and a PMOS constituting the second switch; and
    a fifth NMOS having an impedance value lower than the second threshold, a drain terminal of the fifth NMOS being electrically connected between an NMOS constituting the first switch and an NMOS constituting the second switch.

11. An electronic device including an amplifier, wherein the amplifier comprises:
a first resistor electrically connected to an input terminal;
a second resistor electrically connected to an output terminal;
a switch including a complementary metal-oxide-semiconductor (CMOS) and electrically connected to one end of the second resistor; and
a switch control processor comprising a first impedance electrically connected to a gate terminal of a p-type metal-oxide-semiconductor (PMOS) constituting the switch and a bulk terminal of an n-type metal-oxide-semiconductor (NMOS) constituting the switch, and a second impedance electrically connected to a bulk terminal of the PMOS and a gate terminal of the NMOS,
wherein the first impedance and the second impedance correspond to an impedance value higher than a preset first threshold.

12. The electronic device of claim 11,
wherein the first impedance comprises a first register and a first inductor, and
wherein the second impedance comprises a second register and a second inductor.

13. The electronic device of claim 11, wherein the switch control processor comprises:
a first inverter configured to receive a control signal;
a first CMOS in which a gate terminal of a first PMOS and a gate terminal of a first NMOS are electrically connected to an output terminal of the first inverter;
a second inverter electrically connected to the output terminal of the first inverter;
a second CMOS in which a gate terminal of a second PMOS and a gate terminal of a second NMOS are electrically connected to an output terminal of the second inverter;
a first impedance electrically connected to a source terminal of the first PMOS and a source terminal of the second PMOS and having an impedance value higher than the first threshold; and
a second impedance electrically connected to a source terminal of the first NMOS and a source terminal of the second NMOS and having an impedance value higher than the first threshold.

14. The electronic device of claim 13,
wherein the bulk terminal of the PMOS constituting the CMOS is electrically connected to the source terminal of the first PMOS or the source terminal of the second PMOS, and
wherein the bulk terminal of the NMOS constituting the CMOS is electrically connected to the source terminal of the first NMOS or the source terminal of the second NMOS.

15. The electronic device of claim 13,
wherein the gate terminal of the PMOS constituting the CMOS is electrically connected to an output terminal of the first CMOS, and
wherein the gate terminal of the NMOS constituting the CMOS is electrically connected to an output terminal of the second CMOS.

16. The electronic device of claim 11, wherein the switch comprises:
a first switch including a first CMOS and electrically connected to one end of the second resistor; and
a second switch including a second CMOS and electrically connected to one end of the first switch.

17. The electronic device of claim 16, wherein the switch control processor comprises:
a first inverter configured to receive a control signal;
a first CMOS in which a gate terminal of a first PMOS and a gate terminal of a first NMOS are electrically connected to an output terminal of the first inverter;
a second inverter electrically connected to the output terminal of the first inverter;
a second CMOS in which a gate terminal of a second PMOS and a gate terminal of a second NMOS are electrically connected to an output terminal of the second inverter;
a first impedance electrically connected to a source terminal of the first PMOS and a source terminal of the second PMOS and having an impedance value higher than the first threshold;
a second impedance electrically connected to a source terminal of the first NMOS and a source terminal of the second NMOS and having an impedance value higher than the first threshold;
a third CMOS in which a gate terminal of a third PMOS and a gate terminal of a third NMOS are electrically connected to the output terminal of the first inverter;
a fourth CMOS in which a gate terminal of a fourth PMOS and a gate terminal of a fourth NMOS are electrically connected to the output terminal of the second inverter;
a third impedance electrically connected to a source terminal of the third PMOS and a source terminal of the fourth PMOS and having an impedance value higher than the first threshold; and
a fourth impedance electrically connected to a source terminal of the third NMOS and a source terminal of the fourth NMOS and having an impedance value higher than the first threshold.

18. The electronic device of claim 17,
wherein a bulk terminal of a PMOS constituting the first switch is electrically connected to the source terminal of the first PMOS or the source terminal of the second PMOS,
wherein a bulk terminal of an NMOS constituting the first switch is electrically connected to the source terminal of the first NMOS or the source terminal of the second NMOS,
wherein a bulk terminal of a PMOS constituting the second switch is electrically connected to the source terminal of the third PMOS or the source terminal of the fourth PMOS, and
wherein a bulk terminal of an NMOS constituting the second switch is electrically connected to the source terminal of the third NMOS or the source terminal of the fourth NMOS.

19. The electronic device of claim 16, wherein the amplifier further comprises a third switch having an impedance value lower than a preset second threshold between the first switch and the second switch.

20. The electronic device of claim 19, wherein the third switch comprises:
a fifth PMOS having an impedance value lower than the second threshold, a drain terminal of the fifth PMOS being electrically connected between a PMOS constituting the first switch and a PMOS constituting the second switch; and
a fifth NMOS having an impedance value lower than the second threshold, a drain terminal of the fifth NMOS being electrically connected between an NMOS constituting the first switch and an NMOS constituting the second switch.

\* \* \* \* \*